United States Patent
Huang et al.

(10) Patent No.: US 12,365,986 B2
(45) Date of Patent: Jul. 22, 2025

(54) REMOTE CAPACITIVELY COUPLED PLASMA DEPOSITION OF AMORPHOUS SILICON

(71) Applicant: Applied Materials, Inc., Santa Clara, CA (US)

(72) Inventors: Zubin Huang, Santa Clara, CA (US); Rui Cheng, Santa Clara, CA (US); Chen-An Chen, San Jose, CA (US); Karthik Janakiraman, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1326 days.

(21) Appl. No.: 16/980,325

(22) PCT Filed: Mar. 13, 2019

(86) PCT No.: PCT/US2019/022084
§ 371 (c)(1),
(2) Date: Sep. 11, 2020

(87) PCT Pub. No.: WO2019/190751
PCT Pub. Date: Oct. 3, 2019

(65) Prior Publication Data
US 2021/0040617 A1    Feb. 11, 2021

Related U.S. Application Data

(60) Provisional application No. 62/649,000, filed on Mar. 28, 2018.

(51) Int. Cl.
C23C 16/00 (2006.01)
C23C 16/24 (2006.01)
(Continued)

(52) U.S. Cl.
CPC .............. *C23C 16/50* (2013.01); *C23C 16/24* (2013.01); *C23C 16/45565* (2013.01);
(Continued)

(58) Field of Classification Search
CPC ............ C23C 16/00; H01J 37/00; H01J 21/00
See application file for complete search history.

(56) References Cited

U.S. PATENT DOCUMENTS 4,873,165 A * 10/1989 Karakida ........... G03G 5/14704
430/130
5,399,387 A    3/1995 Law et al.
(Continued)

FOREIGN PATENT DOCUMENTS

CN    103329251 A    9/2013
CN    107810546 A    3/2018
(Continued)

OTHER PUBLICATIONS

International Search Report and Written Opinion dated Jun. 26, 2019 for Application No. PCT/US2019/022084.
(Continued)

*Primary Examiner* — Gordon Baldwin
*Assistant Examiner* — Mohammad Mayy
(74) *Attorney, Agent, or Firm* — Patterson + Sheridan, LLP

(57) ABSTRACT

Method for depositing amorphous silicon materials are provide and include generating a plasma within a plasma unit in fluid communication with a process chamber and flowing the plasma through an ion suppressor to produce an activated fluid containing reactive species and neutral species. The activated fluid either contains no ions or contains a lower concentration of ions than the plasma. The method further includes flowing the activated fluid into a first inlet of a dual channel showerhead within the process chamber
(Continued)

and flowing a silicon precursor into a second inlet of the dual channel showerhead. Thereafter, the method includes flowing a mixture of the activated fluid and the silicon precursor out of the dual channel showerhead and forming an amorphous silicon layer on a substrate disposed in the process chamber.

18 Claims, 2 Drawing Sheets

(51) Int. Cl.
 C23C 16/455 (2006.01)
 C23C 16/50 (2006.01)
 H01L 21/02 (2006.01)
 H01L 21/3205 (2006.01)
(52) U.S. Cl.
 CPC .. H01L 21/02532 (2013.01); H01L 21/02576 (2013.01); H01L 21/02579 (2013.01); H01L 21/02592 (2013.01); H01L 21/0262 (2013.01); H01L 21/32055 (2013.01)

(56) References Cited

U.S. PATENT DOCUMENTS

| | | | |
|---|---|---|---|
| 5,589,233 | A | 12/1996 | Law et al. |
| 5,851,602 | A | 12/1998 | Law et al. |
| 5,865,896 | A | 2/1999 | Nowak et al. |
| 6,444,277 | B1 | 9/2002 | Law et al. |
| 7,754,294 | B2 | 7/2010 | Choi et al. |
| 7,803,722 | B2 | 9/2010 | Liang |
| 8,114,484 | B2 | 2/2012 | Yang et al. |
| 8,642,481 | B2 | 2/2014 | Wang et al. |
| 8,709,551 | B2 | 4/2014 | Fox et al. |
| 8,772,888 | B2 | 7/2014 | Jung et al. |
| 8,956,980 | B1 | 2/2015 | Chen et al. |
| 9,117,855 | B2 | 8/2015 | Cho et al. |
| 9,190,290 | B2 | 11/2015 | Xue et al. |
| 9,502,218 | B2 | 11/2016 | Chen et al. |
| 9,741,545 | B2 | 8/2017 | Chen et al. |
| 10,056,233 | B2 | 8/2018 | Chen et al. |
| 2004/0083967 | A1 | 5/2004 | Yuda et al. |
| 2005/0112901 | A1 | 5/2005 | Ji et al. |
| 2007/0111519 | A1 | 5/2007 | Lubomirsky et al. |
| 2008/0178805 | A1 | 7/2008 | Paterson et al. |
| 2009/0098882 | A1 | 4/2009 | Yoon |
| 2011/0236600 | A1* | 9/2011 | Fox ............... H01L 21/0214 427/579 |
| 2012/0180954 | A1* | 7/2012 | Yang ............ C23C 16/45565 156/345.33 |
| 2012/0247390 | A1 | 10/2012 | Sawada et al. |
| 2013/0034968 | A1 | 2/2013 | Zhang et al. |
| 2013/0052827 | A1 | 2/2013 | Wang et al. |
| 2013/0130506 | A1 | 5/2013 | Wang et al. |
| 2013/0153148 | A1 | 6/2013 | Yang et al. |
| 2014/0144495 | A1 | 5/2014 | Sameshima et al. |
| 2015/0155189 | A1* | 6/2015 | Cho ............... H01J 37/32541 438/731 |
| 2015/0221479 | A1* | 8/2015 | Chen ............. H01J 37/32422 118/723 MP |
| 2015/0279687 | A1 | 10/2015 | Xue et al. |

FOREIGN PATENT DOCUMENTS

| | | |
|---|---|---|
| JP | 2004525509 A | 8/2004 |
| KR | 20130081369 A | 7/2013 |
| KR | 20140043721 A | 4/2014 |
| KR | 20160140884 A | 12/2016 |
| KR | 20170074958 A | 6/2017 |
| KR | 20170141752 A | 12/2017 |

OTHER PUBLICATIONS

Korean Office Action dated Sep. 26, 2023 for Appication No. 10-2020-7030842.
Chinese Office Action dated Jul. 5, 2024 for Application No. 201980027478.4.
Chinese Office Action dated Nov. 13, 2024 for Application No. 201980027478.4.
Chinese Office Action dated Feb. 13, 2025 for Application No. 201980027478.4.

* cited by examiner

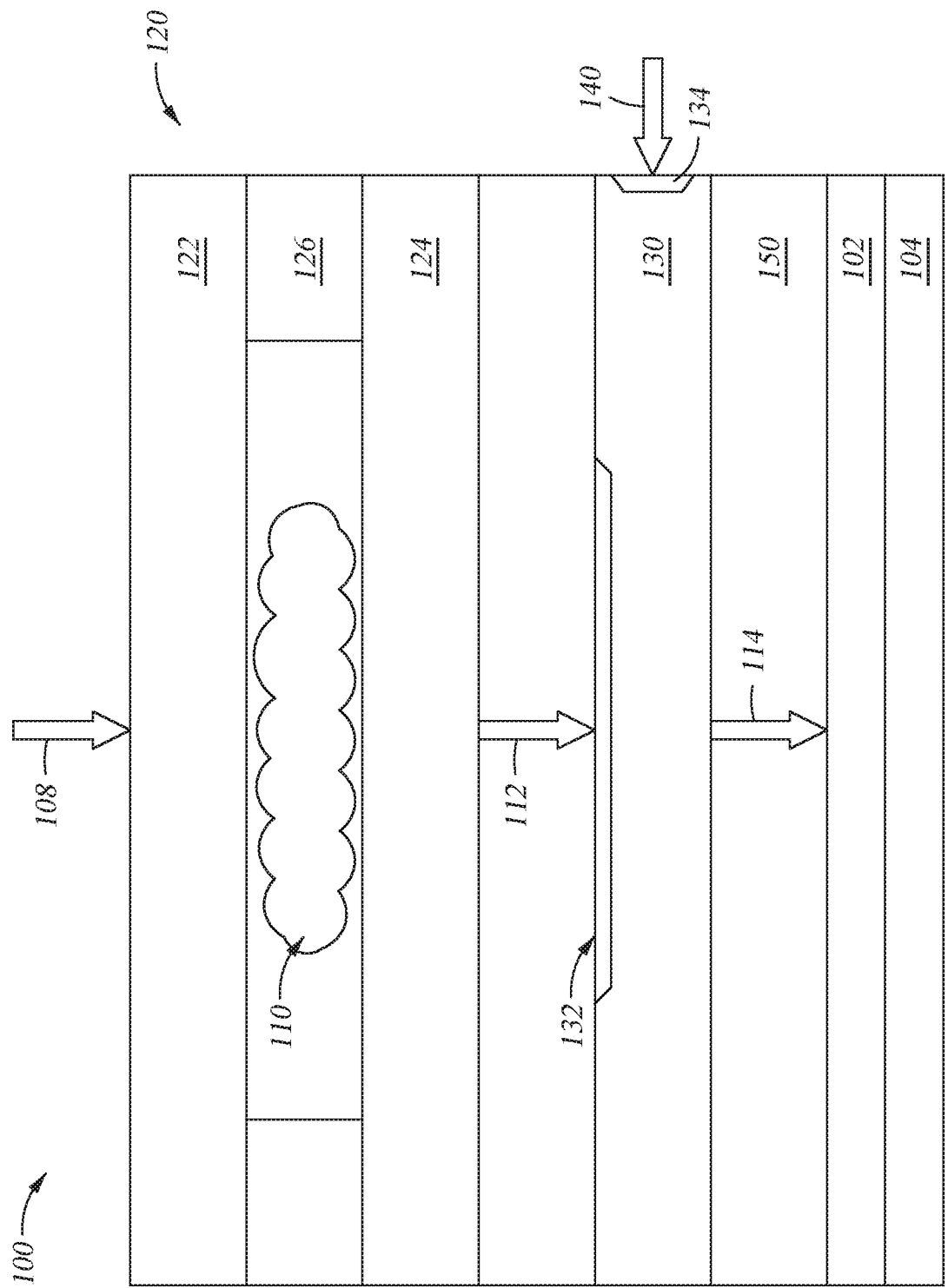

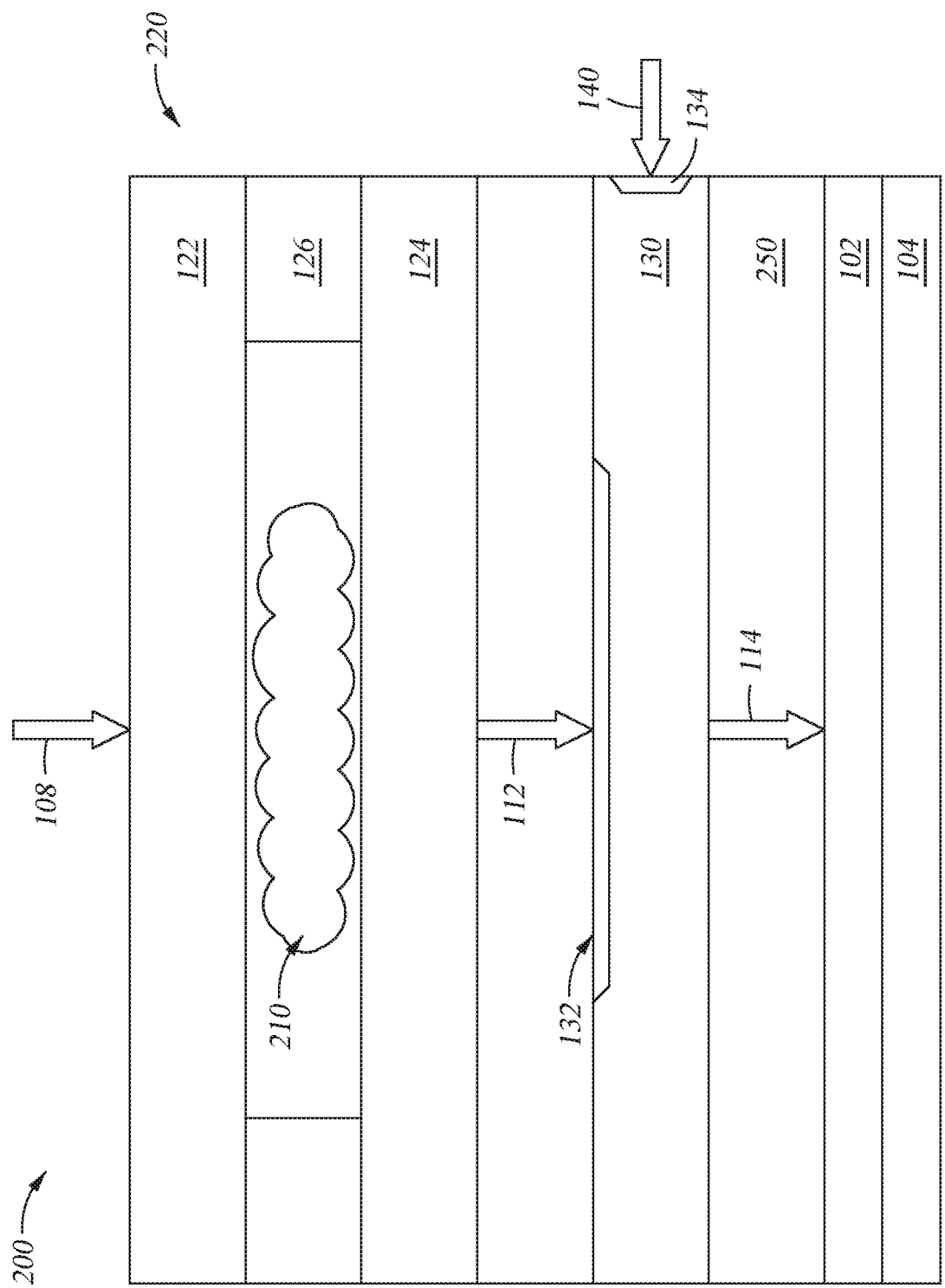

REMOTE CAPACITIVELY COUPLED PLASMA DEPOSITION OF AMORPHOUS SILICON

BACKGROUND

Description of the Related Art

Plasma deposition and etching processes for fabricating semiconductor integrated circuits have been in wide use for decades. These processes typically involve the formation of a plasma from plasma-generating gases that are exposed to electric fields of sufficient power inside the processing chamber to cause the gases to ionize. The temperatures needed to form these gases into plasmas can be much lower than needed to thermally ionize the same gases. Thus, plasma generation processes can be used to generate reactive radical and ion species from the starting gases at significantly lower chamber processing temperatures than is possible by simply heating the gases. This allows the plasma to deposit and/or etch materials from substrate surfaces without raising the substrate temperature above a threshold that will melt, decompose, or otherwise damage materials on the substrate.

Exemplary plasma deposition processes include plasma-enhanced chemical vapor deposition (PECVD) of dielectric materials such as silicon oxide or silicon nitride on exposed surfaces of a substrate. Conventional PECVD involves the mixing together of gases and/or deposition precursors in the processing chamber and striking a plasma from the gases to generate reactive species that react and deposit material on the substrate. The plasma is typically positioned close to the exposed surface of the substrate to facilitate the efficient deposition of the reaction products.

Similarly, plasma etching processes include exposing selected parts of the substrate to plasma activated etching species that chemically react and/or physically sputter materials from the substrate. The removal rates, selectivity, and direction for the plasma etched materials can be controlled with adjustments to the etchant gases, plasma excitation energy, and electrical bias between the substrate and charged plasma species, among other parameters. Some plasma techniques, such as high-density plasma chemical vapor deposition (HDP-CVD), rely on simultaneous plasma etching and deposition to create features on the substrate.

While plasma environments are generally less destructive to substrates than high-temperature deposition environments, plasma environments still create fabrication challenges. Etching precision can be a problem with energetic plasmas that over-etch shallow trenches and gaps. Energetic species in the plasmas, especially ionized species, can create unwanted reactions in a deposited material that adversely affect the material's performance.

Thus, there is a need for methods to provide more precise control over plasma deposition processes for silicon materials, such as amorphous silicon materials, on a substrate during fabrication.

SUMMARY OF THE INVENTION

In one or more embodiments, a method for depositing an amorphous silicon material includes generating a plasma within a plasma unit in fluid communication with a process chamber and flowing the plasma through an ion suppressor to produce an activated fluid containing reactive species and neutral species. The activated fluid either contains no ions or contains a lower concentration of ions than the plasma. The method further includes flowing the activated fluid into a first inlet of a dual channel showerhead within the process chamber and flowing a silicon precursor into a second inlet of the dual channel showerhead. Thereafter, the method includes flowing a mixture of the activated fluid and the silicon precursor out of the dual channel showerhead and forming an amorphous silicon layer on a substrate disposed in the process chamber.

In other embodiments, a method for depositing an amorphous silicon material includes generating a plasma within a plasma unit in fluid communication with a process chamber and flowing the plasma through an ion suppressor to produce an activated fluid comprising reactive species and neutral species. The activated fluid either contains no ions or contains a lower concentration of ions than the plasma. The method further includes flowing the activated fluid, a silicon precursor, and a dopant precursor through a dual channel showerhead to produce a mixture of the activated fluid, the silicon precursor, and the dopant precursor within the process chamber, and exposing a substrate disposed in the process chamber to the mixture to form an amorphous silicon layer on the substrate.

In other embodiments, a method for depositing an amorphous silicon material includes generating a plasma within an electron beam (eBeam) unit in fluid communication with a process chamber, and flowing the plasma through an ion suppressor to produce an activated fluid comprising reactive species and neutral species. The activated fluid either contains no ions or contains a lower concentration of ions than the plasma. The method further includes flowing the activated fluid and a silicon precursor through a dual channel showerhead to produce a mixture of the activated fluid and the dopant precursor within the process chamber, and exposing a substrate disposed in the process chamber to the mixture to form an amorphous silicon layer on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

FIG. 1 depicts a capacitively coupled plasma chemical vapor deposition system that can be used to deposit amorphous silicon layers and other materials, as discussed and described in one or more embodiments herein; and FIG. 2 depicts a chemical vapor deposition system with an electron beam unit that can be used to deposit amorphous silicon layers and other materials, as discussed and described in one or more embodiments herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments discussed and described herein provide methods and systems for depositing amorphous layers and materials on a substrate. FIG. 1 depicts a capacitively coupled plasma (CCP) chemical vapor deposition (CVD) system 100 that can be used to deposit amorphous silicon layers and other materials. In one or more embodiments, a method for depositing the amorphous silicon material includes generating a plasma 110 within a plasma unit 120 in fluid communication with a process chamber 150. The plasma unit 120 can include a faceplate 122 and an ion blocker 124 separated by an isolator or ion suppressor 126. One or more carrier gases and/or one or more reactive gases (depicted as gas flow 108) can be introduced into the plasma unit 120 and can be ignited to generate or otherwise produce the plasma 110 therebetween.

The plasma 110 can be flowed or passed through the ion suppressor 126 to produce an activated fluid 112 containing one or more reactive species and/or one or more neutral species. In some examples, the activated fluid 112 contains no ions or substantially no ions. In other examples, the activated fluid 112 contains one or more ionic species, but has a lower concentration of ions than the plasma 110, such that the ion concentration of the activated fluid 112 is less than the ion concentration of the plasma. The ion suppressor 126 prohibits most, if not all, of the ions from passing therethrough to produce the activated fluid 112 that is enriched with reactive species and/or neutral species.

In one or more embodiments, the activated fluid 112 contains an ion concentration of about 50%, about 65%, or about 80% to about 85%, about 90%, about 95%, about 97%, about 98%, about 99%, about 99.5%, or about 99.9% less than the ion concentration of the plasma. For example, the activated fluid 112 contains an ion concentration of about 50% to about 99.9%, about 50% to about 99%, about 50% to about 95%, about 50% to about 90%, about 50% to about 85%, about 50% to about 80%, about 70% to about 99.9%, about 70% to about 99%, about 70% to about 95%, about 70% to about 90%, about 70% to about 85%, about 70% to about 80%, about 90% to about 99.9%, about 90% to about 99%, about 90% to about 95%, or about 90% to about 92% less than the ion concentration of the plasma.

The activated fluid 112 can be flowed or passed into a first inlet 132 of a dual channel showerhead 130 within the process chamber 150. One or more silicon precursors and/or one or more dopant precursors (e.g., boron or phosphorous precursor) (precursors depicted by arrow 140) can be flowed or passed into one or more inlets 134 (e.g., one inlet is shown, but two, three or more inlets can be included) on the dual channel showerhead 130. The activated fluid, the silicon precursor, and one or more optional dopant precursors can be mixed or otherwise combined within the dual channel showerhead 130 to produce a gaseous or fluid mixture 114.

Thereafter, the mixture 114 containing the activated fluid, the silicon precursor, and the one or more optional dopant precursors can be flowed or passed from the dual channel showerhead 130 to the substrate 102 positioned there below, such as on a substrate support 104. An amorphous silicon layer is deposited or otherwise formed on the substrate 102 disposed in the process chamber 150.

FIG. 2 depicts a CVD system 200 with an electron beam unit 220 that can be used to deposit amorphous silicon layers and other materials. In one or more embodiments, a method for depositing the amorphous silicon material includes generating a plasma 210 within the electron beam unit 220 (also a plasma generator) that is in fluid communication with a process chamber 250. The electron beam unit 220 can include a faceplate 122 and an ion blocker 124 separated by an isolator or ion suppressor 126. One or more carrier gases and/or one or more reactive gases (depicted as gas 108) can be introduced into the electron beam unit 220 and can be ignited to generate or otherwise produce the plasma 210 therebetween via the electron beam.

The plasma 210 can be flowed or passed through the ion suppressor 126 to produce an activated fluid 112 containing one or more reactive species and/or one or more neutral species. In some examples, the activated fluid 112 contains no ions or substantially no ions. In other examples, the activated fluid 112 contains one or more ionic species, but has a lower concentration of ions than the plasma 210. The ion suppressor 126 prohibits most, if not all, of the ions from passing therethrough to produce the activated fluid 112 that is enriched with reactive species and/or neutral species.

The activated fluid 112 can be flowed or passed into a first inlet 132 of a dual channel showerhead 130 within the process chamber 250. One or more silicon precursors and/or one or more dopant precursors (e.g., boron or phosphorous precursor) (precursors depicted by arrow 140) can be flowed or passed into one or more inlets 134 (e.g., one inlet is shown, but two, three or more inlets can be included) on the dual channel showerhead 130. The activated fluid, the silicon precursor, and one or more optional dopant precursors can be mixed or otherwise combined within the dual channel showerhead 130 to produce a gaseous or fluid mixture 114.

Thereafter, the mixture 114 containing the activated fluid, the silicon precursor, and the one or more optional dopant precursors can be flowed or passed from the dual channel showerhead 130 to the substrate 102 positioned there below, such as on a substrate support 104. An amorphous silicon layer is deposited or otherwise formed on the substrate 102 disposed in the process chamber 250.

Further details and disclosure related to the plasma unit 120, the dual channel showerhead 130, the process chamber 150, and other components of the systems 100, 200 are further described in U.S. Pat. No. 9,144,147, which is herein incorporated by reference in its entirety.

The systems 100, 200 can also further include a power supply (not shown) electrically coupled to the CCP unit or plasma unit 120 or the electron beam unit 220 to provide electric power to the faceplate 122 and/or the ion suppressor 124 to generate a plasma 110, 210 in the plasma excitation region. The power supply may be configured to deliver an adjustable amount of power to the unit 120, 220 depending on the process performed. In deposition processes for example, the power delivered to the unit 120, 220 may be adjusted to set the conformality of the deposited layer. Deposited dielectric films are typically more flowable at lower plasma powers and shift from flowable to conformal when the plasma power is increased. For example, an argon containing plasma 110, 210 maintained in the plasma excitation region may produce a more flowable silicon layer as the plasma or RF power is decreased from about 1,000 watts to about 100 watts or lower (e.g., about 900, 800, 700, 600, or 500 watts or less), and a more conformal layer as the plasma power is increased from about 1,000 watts or more (e.g., about 1,000, 1,100, 1,200, 1,300, 1,400, 1,500, 1600, 1,700 watts or greater). As the plasma power increases from low to high, the transition from a flowable to conformal deposited material or layer may be relatively smooth and continuous or progress through relatively discrete thresholds. The plasma power (either alone or in addition to other deposition parameters) may be adjusted to select a balance between the conformal and flowable properties of the deposited material or layer.

The plasma, RF, or electron beam power can be from about 10, about 50, about 100, about 150, about 200, about 300, or about 500 watts to about 600, about 700, about 800, about 1,000, about 1,200, about 1,500, about 1,800, about 2,000, or greater. For example, the plasma, RF, or electron beam power can be from about 10 watts to about 2,000 watts, about 10 watts to about 1,500 watts, about 10 watts to about 1,000 watts, about 10 watts to about 500 watts, about 10 watts to about 100 watts, about 100 watts to about 2,000 watts, about 100 watts to about 1,500 watts, about 100 watts to about 1,000 watts, about 100 watts to about 500 watts, or about 100 watts to about 250 watts.

The pressure within the process chamber can be about 0.1, about 1, about 5, about 10, about 25, or about 50 Torr to about 75, about 100, about 150, about 200, or about 300 Torr. For example, the pressure within the process chamber can be about 0.1 Torr to about 300 Torr, about 0.1 Torr to about 200 Torr, about 0.1 Torr to about 100 Torr, about 0.1 Torr to about 50 Torr, about 0.1 Torr to about 10 Torr, about 10 Torr to about 300 Torr, about 10 Torr to about 200 Torr, about 10 Torr to about 100 Torr, or about 10 Torr to about 50 Torr.

The temperature of the faceplate can be about −50° C., about −25° C., about 0° C., about 20° C., about 30° C., or about 50° C. to about 80° C., about 100° C., about 150° C., about 200° C., or about 250° C. For example, the temperature of the faceplate can be about −50° C. to about 250° C., about −50° C. to about 200° C., about −50° C. to about 150° C., about −50° C. to about 100° C., about −50° C. to about 50° C., about −50° C. to about 0° C., about 0° C. to about 250° C., about 0° C. to about 200° C., about 0° C. to about 150° C., about 0° C. to about 100° C., about 0° C. to about 50° C., about 0° C. to about 25° C., about 25° C. to about 250° C., about 25° C. to about 200° C., about 25° C. to about 150° C., about 25° C. to about 100° C., or about 25° C. to about 50° C.

The temperature of the heater, the substrate support, the substrate, and/or the process chamber can be about −50° C., about −25° C., about 0° C., about 20° C., about 30° C., about 50° C., about 80° C., or about 100° C. to about 150° C., about 200° C., about 250° C., about 300° C., about 350° C., about 400° C., or about 450° C. For example, the temperature of the heater, the substrate support, the substrate, and/or the process chamber can be about −50° C. to about 450° C., about −50° C. to about 400° C., about −50° C. to about 350° C., about −50° C. to about 300° C., about −50° C. to about 250° C., about −50° C. to about 200° C., about −50° C. to about 150° C., about −50° C. to about 100° C., about −50° C. to about 50° C., about −50° C. to about 0° C., about 0° C. to about 450° C., about 0° C. to about 400° C., about 0° C. to about 350° C., about 0° C. to about 300° C., about 0° C. to about 250° C., about 0° C. to about 200° C., about 0° C. to about 150° C., about 0° C. to about 100° C., about 0° C. to about 50° C., about 0° C. to about 25° C., about 25° C. to about 450° C., about 25° C. to about 400° C., about 25° C. to about 350° C., about 25° C. to about 300° C., about 25° C. to about 250° C., about 25° C. to about 200° C., about 25° C. to about 150° C., about 25° C. to about 100° C., or about 25° C. to about 50° C.

In one or more embodiments, one or more carrier gas and/or one or more reactive species gases are flowed or passed into and through the plasma unit or the electron beam unit. The carrier gas and/or the reactive species gas can be or include, but is not limited to, argon, neon, helium, krypton, tetrafluoromethane, nitrogen, hydrogen, radicals thereof, or any combination thereof. In one or more examples, hydrogen radicals are generated along with neutral and radical carrier gas to produce the activated gas or fluid. The silicon precursor can be or include, but is not limited to, one or more of silane, disilane, trisilane, trisilylamine (TSA), disilylamine (DSA), one or more fluorosilanes, one or more chlorosilanes, or any combination thereof. The fluorosilane can have the chemical formula of $SiF_xH_{4-x}$ and the chlorosilane can have the chemical formula of $SiCl_xH_{4-x}$, where x is an integer of 1, 2, 3, or 4.

The flow rate of the carrier gas and/or the reactive species gas can be from about 10 sccm to about 3,000 sccm, about 10 sccm to about 2,000 sccm, about 10 sccm to about 1,000 sccm, about 10 sccm to about 500 sccm, or about 10 sccm to about 100 sccm. The flow rate of the silicon precursor can be from about 10 sccm to about 500 sccm, about 10 sccm to about 300 sccm, about 10 sccm to about 200 sccm, about 10 sccm to about 100 sccm, or about 10 sccm to about 50 sccm. The flow rate of the dopant precursor can be from about 1 sccm to about 100 sccm, about 1 sccm to about 80 sccm, about 1 sccm, to about 50 sccm, about 1 sccm to about 30 sccm, about 1 sccm to about 20 sccm, about 1 sccm to about 10 sccm, or about 1 sccm to about 5 sccm.

In embodiments a dopant is used to produce a doped, amorphous silicon material or layer, the dopant precursor can be or include, but is not limited to, one or more of boron-containing precursors, phosphorous-containing precursors, carbon-containing precursors, or any combination thereof. The boron-containing precursor can be or include, but is not limited to, diborane, triborane, one or more trialkyl boranes (e.g., trimethyl borane or triethyl borane), one or more boron halides (e.g., boron trifluoride or boron trichloride), one or more triallyl boranes, or any combination thereof. The phosphorous-containing precursor can be or include, but is not limited to, one or more of phosphine, phosphorous oxychloride, one or more alkyl phosphites (e.g., monomethyl phosphite, dimethyl phosphite, or trimethyl phosphite), or any combination thereof.

Embodiments of the present disclosure further relate to any one or more of the following paragraphs:

1. A method, comprising: generating a plasma within a plasma unit in fluid communication with a process chamber; flowing the plasma through an ion suppressor to produce an activated fluid comprising reactive species and neutral species, wherein the activated fluid contains no ions or a lower concentration of ions than the plasma; flowing the activated fluid into a first inlet of a dual channel showerhead within the process chamber; flowing a silicon precursor into a second inlet of the dual channel showerhead; flowing a mixture of the activated fluid and the silicon precursor out of the dual channel showerhead; and forming an amorphous silicon layer on a substrate disposed in the process chamber.

2. The method of paragraph 1, further comprising flowing a dopant precursor into the dual channel showerhead, wherein the dopant precursor comprises a boron-containing precursor, a phosphorous-containing precursor, or any combination thereof.

3. The method of paragraph 2, wherein the dopant precursor comprises the boron-containing precursor, and wherein the boron-containing precursor comprises diborane, triborane, a trialkyl borane, a triallyl borane, or any combination thereof.

4. The method of paragraph 2 or 3, wherein the dopant precursor comprises the phosphorous-containing precursor, and wherein the phosphorous-containing precursor comprises phosphine, phosphorous oxychloride, an alkyl phosphite, or any combination thereof.

5. The method according to any one of paragraphs 1-4, wherein the silicon precursor comprises silane, disilane, trisilane, trisilylamine (TSA), disilylamine (DSA), a fluorosilane ($SiF_xH_{4-x}$), a chlorosilane ($SiCl_xH_{4-x}$), or any combination thereof, where x is an integer of 1, 2, 3, or 4.

6. The method according to any one of paragraphs 1-5, further comprising flowing a carrier gas through the plasma unit, wherein the carrier gas comprises argon, helium, nitrogen, hydrogen, or any combination thereof.

7. The method according to any one of paragraphs 1-6, wherein the plasma unit comprises a capacitively coupled plasma (COP) unit or an electron beam.

8. A method, comprising: generating a plasma within a plasma unit in fluid communication with a process chamber; flowing the plasma through an ion suppressor to produce an activated fluid comprising reactive species and neutral species, wherein the activated fluid contains no ions or a lower concentration of ions than the plasma; flowing the activated fluid, a silicon precursor, and a dopant precursor through a dual channel showerhead to produce a mixture of the activated fluid, the silicon precursor, and the dopant precursor within the process chamber; and exposing a substrate disposed in the process chamber to the mixture to form an amorphous silicon layer on the substrate.

9. The method according of paragraph 8, wherein the dopant precursor comprises a boron-containing precursor, a phosphorous-containing precursor, or any combination thereof.

10. The method of paragraph 9, wherein the dopant precursor comprises the boron-containing precursor, and wherein the boron-containing precursor comprises diborane, triborane, a trialkyl borane, a triallyl borane, a boron halide, or any combination thereof.

11. The method of paragraph 9 or 10, wherein the dopant precursor comprises the phosphorous-containing precursor, and wherein the phosphorous-containing precursor comprises phosphine, phosphorous oxychloride, an alkyl phosphite, or any combination thereof.

12. The method according to any one of paragraphs 8-11, wherein the silicon precursor comprises silane, disilane, trisilane, trisilylamine (TSA), disilylamine (DSA), a fluorosilane ($SiF_xH_{4-x}$), a chlorosilane ($SiCl_xH_{4-x}$), or any combination thereof, where x is an integer of 1, 2, 3, or 4.

13. The method according to any one of paragraphs 8-12, further comprising flowing a carrier gas through the plasma unit, wherein the carrier gas comprises argon, helium, nitrogen, hydrogen, or any combination thereof.

14. The method according to any one of paragraphs 8-13, wherein the plasma unit comprises a capacitively coupled plasma (COP) unit or an electron beam.

15. A method, comprising: generating a plasma within an electron beam unit in fluid communication with a process chamber; flowing the plasma through an ion suppressor to produce an activated fluid comprising reactive species and neutral species, wherein the activated fluid contains no ions or a lower concentration of ions than the plasma; flowing the activated fluid and a silicon precursor through a dual channel showerhead to produce a mixture of the activated fluid and the dopant precursor within the process chamber; and exposing a substrate disposed in the process chamber to the mixture to form an amorphous silicon layer on the substrate.

16. The method of paragraph 15, further comprising flowing a dopant precursor into the dual channel showerhead, wherein the dopant precursor comprises a boron-containing precursor, a phosphorous-containing precursor, or any combination thereof.

17. The method of paragraph 16, wherein the dopant precursor comprises the boron-containing precursor, and wherein the boron-containing precursor comprises diborane, triborane, a trialkyl borane, a triallyl borane, a boron halide, or any combination thereof.

18. The method of paragraph 16 or 17, wherein the dopant precursor comprises the phosphorous-containing precursor, and wherein the phosphorous-containing precursor comprises phosphine, phosphorous oxychloride, an alkyl phosphite, or any combination thereof.

19. The method according to any one of paragraphs 15-18, wherein the silicon precursor comprises silane, disilane, trisilane, trisilylamine (TSA), disilylamine (DSA), a fluorosilane ($SiF_xH_{4-x}$), a chlorosilane ($SiCl_xH_{4-x}$), or any combination thereof, where x is an integer of 1, 2, 3, or 4.

20. The method according to any one of paragraphs 15-19, further comprising flowing a carrier gas through the electron beam unit, wherein the carrier gas comprises argon, helium, nitrogen, hydrogen, or any combination thereof.

A composition, item, material, or film produced by the method according to any one of paragraphs 1-20.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or is preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated, Certain lower limits, upper limits and ranges appear in one or more claims below.

What is claimed is:

1. A method, comprising:
   generating a plasma within a plasma unit in fluid communication with a process chamber, wherein the plasma unit comprises a capacitively coupled plasma (CCP) unit;
   flowing the plasma through an ion suppressor to produce an activated fluid comprising reactive species and neutral species, wherein the activated fluid has an ion concentration of about 70% to about 95% less than an ion concentration of the plasma;
   flowing the activated fluid into a first inlet of a dual channel showerhead within the process chamber;
   flowing a silicon precursor into a second inlet of the dual channel showerhead;
   flowing a mixture of the activated fluid and the silicon precursor out of the dual channel showerhead to a substrate disposed in the process chamber; and
   forming an amorphous silicon layer on the substrate.

2. The method of claim 1, further comprising flowing a dopant precursor into the dual channel showerhead, wherein the mixture of the activated fluid and the silicon precursor further comprises the dopant precursor, and wherein the dopant precursor comprises a boron-containing precursor, a phosphorous-containing precursor, or any combination thereof.

3. The method of claim 2, wherein the dopant precursor comprises the boron-containing precursor, and wherein the boron-containing precursor comprises diborane, triborane, a trialkyl borane, a triallyl borane, or any combination thereof.

4. The method of claim 2, wherein the dopant precursor comprises the phosphorous-containing precursor, and wherein the phosphorous-containing precursor comprises phosphine, phosphorous oxychloride, an alkyl phosphite, or any combination thereof.

5. The method of claim 1, wherein the silicon precursor comprises silane, disilane, trisilane, trisilylamine (TSA), disilylamine (DSA), a fluorosilane ($SiF_xH_{4-x}$), a chlorosilane ($SiCl_xH_{4-x}$), or any combination thereof, where x is an integer of 1, 2, 3, or 4.

6. The method of claim 1, further comprising flowing a carrier gas through the plasma unit, wherein the carrier gas comprises argon, helium, nitrogen, hydrogen, or any combination thereof.

7. A method, comprising:
generating a plasma within a plasma unit in fluid communication with a process chamber, wherein the plasma unit comprises a capacitively coupled plasma (CCP) unit;
flowing the plasma through an ion suppressor to produce an activated fluid comprising reactive species and neutral species, wherein the activated fluid has an ion concentration of about 70% to about 95% less than an ion concentration of the plasma;
flowing the activated fluid, a silicon precursor, and a dopant precursor through a dual channel showerhead to produce a mixture of the activated fluid, the silicon precursor, and the dopant precursor within the process chamber; and
exposing a substrate disposed in the process chamber to the mixture to form an amorphous silicon layer on the substrate.

8. The method of claim 7, wherein the dopant precursor comprises a boron-containing precursor, a phosphorous-containing precursor, or any combination thereof.

9. The method of claim 7, wherein the dopant precursor comprises a boron-containing precursor, and wherein the boron-containing precursor comprises diborane, triborane, a trialkyl borane, a triallyl borane, a boron halide, or any combination thereof.

10. The method of claim 7, wherein the dopant precursor comprises a phosphorous-containing precursor, and wherein the phosphorous-containing precursor comprises phosphine, phosphorous oxychloride, an alkyl phosphite, or any combination thereof.

11. The method of claim 7, wherein the silicon precursor comprises silane, disilane, trisilane, trisilylamine (TSA), disilylamine (DSA), a fluorosilane ($SiF_xH_{4-x}$), a chlorosilane ($SiCl_xH_{4-x}$), or any combination thereof, where x is an integer of 1, 2, 3, or 4.

12. The method of claim 7, further comprising flowing a carrier gas through the plasma unit, wherein the carrier gas comprises argon, helium, nitrogen, hydrogen, or any combination thereof.

13. A method, comprising:
generating a plasma within a capacitively coupled plasma (CCP) unit in fluid communication with a process chamber;
flowing the plasma through an ion suppressor to produce an activated fluid comprising reactive species and neutral species, wherein the activated fluid has an ion concentration of about 70% to about 95% less than an ion concentration of the plasma;
flowing the activated fluid and a silicon precursor through a dual channel showerhead to produce a mixture of the activated fluid within the process chamber; and
exposing a substrate disposed in the process chamber to the mixture to form an amorphous silicon layer on the substrate.

14. The method of claim 13, further comprising flowing a dopant precursor into the dual channel showerhead, wherein the dopant precursor comprises a boron-containing precursor, a phosphorous-containing precursor, or any combination thereof.

15. The method of claim 14, wherein the silicon precursor comprises silane, disilane, trisilane, trisilylamine (TSA), disilylamine (DSA), a fluorosilane ($SiF_xH_{4-x}$), a chlorosilane ($SiCl_xH_{4-x}$), or any combination thereof, where x is an integer of 1, 2, 3, or 4.

16. The method of claim 14, wherein the dopant precursor comprises the boron-containing precursor, and wherein the boron-containing precursor comprises diborane, triborane, a trialkyl borane, a triallyl borane, a boron halide, or any combination thereof.

17. The method of claim 14, wherein the dopant precursor comprises the phosphorous-containing precursor, and wherein the phosphorous-containing precursor comprises phosphine, phosphorous oxychloride, an alkyl phosphite, or any combination thereof.

18. The method of claim 13, further comprising flowing a carrier gas through the electron beam unit, wherein the carrier gas comprises argon, helium, nitrogen, hydrogen, or any combination thereof.

* * * * *